(12) United States Patent
Kim et al.

(10) Patent No.: US 6,223,800 B1
(45) Date of Patent: May 1, 2001

(54) DIE BONDING APPARATUS

(75) Inventors: Seong-bong Kim, Yongin; Myeong-Kyu Yeom, Suwon, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/151,354

(22) Filed: Sep. 10, 1998

(30) Foreign Application Priority Data

Apr. 2, 1998 (KR) .................................................. 98-11638

(51) Int. Cl.⁷ ............................... B23K 1/00; B23K 1/14; B32B 31/00
(52) U.S. Cl. ......................... 156/556; 156/558; 156/566; 156/578; 428/118; 428/126; 228/6.2
(58) Field of Search ..................................... 156/556, 558, 156/564, 566, 578; 29/729, 739, 740, 742, 832, 840; 228/6.2; 438/110, 118, 119, 125, 126

(56) References Cited

U.S. PATENT DOCUMENTS

| | | | |
|---|---|---|---|
| 4,878,610 | * | 11/1989 | Mori et al. ............................. 228/6.2 |
| 5,446,080 | * | 8/1995 | Shima et al. ........................... 524/99 |
| 5,765,277 | * | 6/1998 | Jin et al. ................................ 29/743 |
| 5,776,799 | * | 7/1998 | Song et al. ........................... 438/118 |
| 5,799,858 | * | 9/1998 | Nam et al. ............................. 228/6.2 |
| 5,871,610 | * | 2/1999 | Minohoshi et al. .................. 156/362 |
| 5,979,739 | * | 11/1999 | Jin et al. ................................ 228/6.2 |

* cited by examiner

*Primary Examiner*—Mark A. Osele
*Assistant Examiner*—Sue A. Purvis
(74) *Attorney, Agent, or Firm*—Burns, Doane, Swecker & Mathis, L.L.P.

(57) ABSTRACT

A die bonding apparatus includes: a lead frame supply station for accommodating a plurality of lead frames; a frame transferring device for picking up the lead frame and transferring it to an Ag epoxy application table or to a traveling rail; a frame fixing station for fixing the lead frame to the Ag epoxy application table by suction power of a vacuum pump or moving it back and forth through actuation of a motor; an Ag epoxy supply station for ejecting a predetermined amount of Ag epoxy through a nozzle to the top surface of the lead frame; a moving device for moving the lead frame forward on the traveling rail; a preheating station for receiving the lead frame into a magazine and preheating it; a wafer placement station for transferring wafers sequentially supplied from a wafer supply station to a predetermined location through rotation; a die transferring device for picking up a die and transferring it to a work site for die bonding; a die bonding station for precisely bonding the die to a site where a tape is stuck or Ag epoxy is applied in the lead frame according to lead on chip (LOC) or normal feature of the lead frame; and a stocker for accommodating the lead frame into an internal magazine.

2 Claims, 6 Drawing Sheets

DIE BONDING APPARATUS

BACKGROUND OF THE INVENTION

1. Field of the Invention

The present invention relates to a die bonding apparatus and, more particularly, to a die bonding apparatus for selectively performing LOC (lead on chip) die bonding and normal die bonding through regulation of a simple control function when bonding semiconductor chips of a memory device from a wafer to lead frames, thereby to increase efficiency in use of equipment and reduce the cost for equipment.

2. Discussion of Related Art

A semiconductor lead frame is one of the core elements constructing a semiconductor package together with a wafer.

It has been well known that the lead frame serves as both a lead for connecting the inside of the semiconductor package and the outside, or the circuit board, and a frame for supporting a semiconductor chip.

This semiconductor lead frame is made in such a manner of forming a predetermined shape out of thin film material using a press dies sequentially transferred or through an etching step utilizing chemicals.

The semiconductor lead frame manufactured through the ways as illustrated above is put together with the other components including a chip of a memory device through an assembly process and, more specifically, constructs the semiconductor package through die bonding and wire bonding.

On the thin film are formed a plurality of unit lead frames which are arranged in all directions, and adhesive tape for the mounting of the chip is applied to the bottom surface, thus forming unit lead frame members.

Each unit lead frame members where the adhesive tape is applied is arranged on a rail through vacuum adsorption and then the die bonding step is performed.

For the die bonding step, a die is picked up through suction by a nozzle from a silicon wafer where multiple dice are formed, each die being a unit device, and then transferred to a predetermined site to be mounted on. Subsequently, each die is transferred below the arranged lead frame and mounted thereon. The bonding is, in turn, performed using things like a thermo-compression bonding machine.

After this bonding step, the lead frame is transferred to passing through the next wire bonding step. During the wire bonding, each lead is connected to the circuit of the die through a metal wire, such as gold or silver having excellent conductivity.

Figure 1:
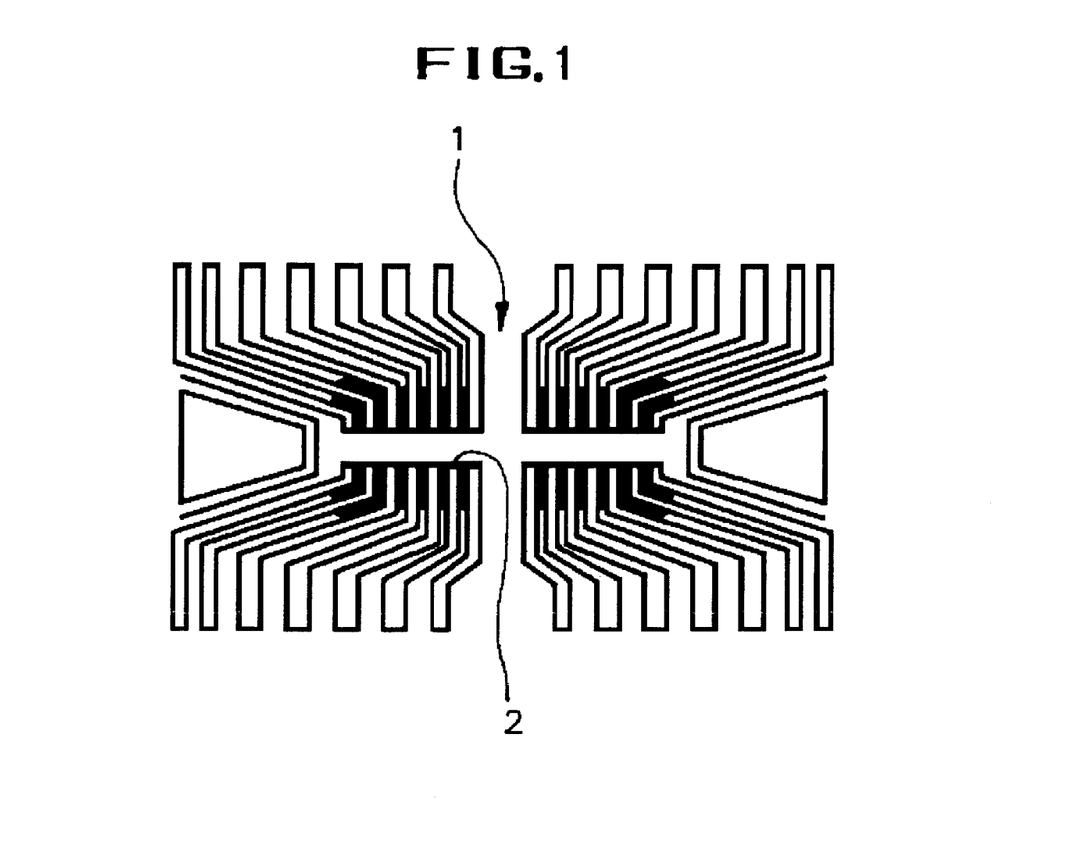
FIG. 1 is a schematic view showing a lead frame to the bottom surface of which a tape is applied.
Figure 2A:
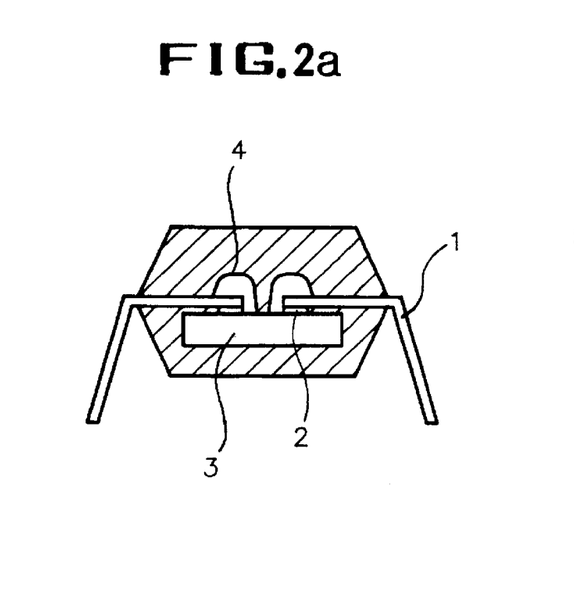
FIGS. 2a and 2b are schematic views illustrating LOC die bonding and normal die bonding respectively.

In other words, adhesive tape 2 for the bonding of a chip is applied to the multiple unit lead frames 1 formed out of the thin film in a taping process as illustrated FIG. 1. The lead frame where the adhesive tape 2 applied is then transferred facing downward and the die 3, such as a chip of a memory device, is mounted on the lead frame from below. At the next wire bonding step, the nodes of the die and the lead frame are bonded through the wire 4 by way of LOC die bonding widely used, as shown in FIG. 2a.

Figure 2B:
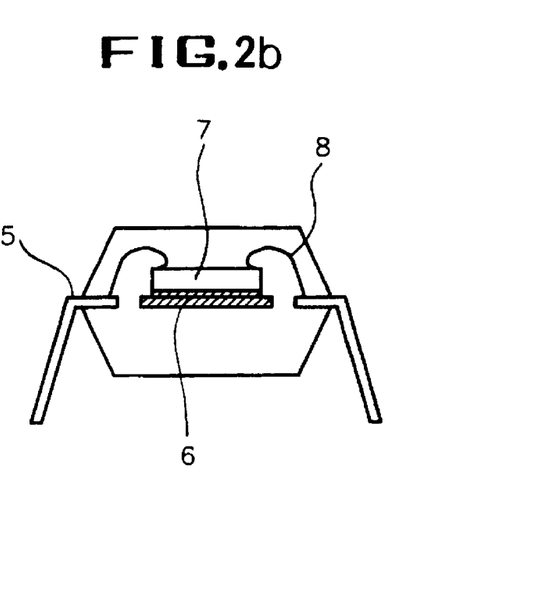

Alternatively, adhesive Ag epoxy is applied to the top surface of a lead frame 5 and a die 7 is directly mounted down on the lead frame from above before bonding the nodes of the die 7 to the lead frame 5 using a wire 8 in normal die bonding, as shown in FIG. 2b, which is often used due to its operation efficiency.

At the early stage of development where the size of the die is large, the LOC die bonding is primarily used because an overall package can be reduced, but when it is not necessary to reduce the size of the overall package due to the small size of the die, the normal bonding is used much more frequently than the LOC die bonding.

However, according to the conventional die bonding apparatus, separate apparatus must be used for each LOC die bonding step and normal die bonding step because operations for each step are different, so additional production facilities must be installed. In addition, there is a drawback that the facilities are left and not used because the apparatus for the LOC die bonding or normal die bonding cannot used for other processes.

SUMMARY OF THE INVENTION

Accordingly, the present invention is directed to a die bonding apparatus that substantially obviates one or more of the limitations and disadvantages of the related art.

An object of the present invention is to provide a die bonding apparatus for selectively performing LOC die bonding and normal die bonding through regulation of a simple control function when bonding semiconductor chips of a memory device from a wafer to lead frames, thereby to increase efficiency in use of equipment and reduce the cost for equipment.

Additional features and advantages of the invention will be set forth in the description which follows, and in part will be apparent from the description, or may be learned by practice of the invention. The objectives and other advantages of the invention will be realized and attained by the structure as illustrated in the written description and claims hereof, as well as the appended drawings.

To achieve these and other advantages, and in accordance with the purpose of the present invention as embodied and broadly described, a die bonding apparatus includes: a lead frame supply station for accommodating a plurality of lead frames; a frame transferring device for transferring the lead frame piled up in the lead frame supply station to an Ag epoxy application table or transferring it to a traveling rail; a frame fixing station for fixing the lead frame transferred by the frame transferring device to the Ag epoxy application table through suction power of a vacuum pump and moving the lead frame back and forth through actuation of a motor; an Ag epoxy supply station for applying a predetermined amount of Ag epoxy which is an adhesive bonding agent to a site of the lead frame fixed by the frame fixing station, the site will being in contact with a die; a moving device for moving the lead frame on the traveling rail, which is transferred by the frame transferring device after the application of the Ag epoxy at the Ag epoxy supply station, to a preheating station in front using a pushing piece; a wafer supply station for sequentially supplying semiconductor wafers externally and manually supplied thereto; a wafer placement station for transferring the wafers sequentially supplied from the wafer supply station to a predetermined location while rotating about a shaft; a die transferring device for picking up the semiconductor wafers (chips) placed at the predetermined location in the wafer placement station one by one and transferring each chip to a work site for the die bonding; a die bonding station for precisely bonding the die transferred by the die transferring device to a bottom surface where an adhesive tape is stuck in the lead frame which has been fed from the preheating station via a traveling rail; and a stocker for accommodating the lead frames to which each die of the semiconductor device has been bonded at the die bonding station while moving an internal magazine up and down.

It is preferable to form the lead frame supply station as a loading box so as to accommodate a plurality of lead frames therein.

The frame transferring device includes: a vacuum suction for picking up the lead frames which are piled up in the lead frame supply station; an up-and-down shifter for raising or putting down the lead frame by moving the vacuum suction up and down; and a right and left shifter for transferring the lead frame to the traveling rail or to the Ag epoxy application table by moving the vacuum suction and up-and-down shifter to the right and left.

The frame fixing station of the present invention includes: a vacuum pump for fixing the lead frame carried by the frame transferring device to the precise site on the Ag epoxy application table by adsorbing the lead frame from below; and a motor for moving the lead frame back and forth.

The Ag epoxy supply station includes: a nozzle for ejecting the predetermined amount of Ag epoxy on the site where the die will be placed in the lead frame which is temporarily fixed to the Ag epoxy application table; a pumping device connected to the upper portion of the nozzle, for pumping the predetermined amount of the Ag epoxy at a time with proper pressure; a camera located over the pumping device, for monitoring the nozzle so as to allow the Ag epoxy to be ejected to the precise application site in the lead frame; a Z axis driver for moving the nozzle, pumping device, and camera up and down so as to allow the easy movement of the lead frame and the application of the Ag epoxy to the lead frame; and an X axis driver for moving the Z axis driver to the right and left so as to allow the application of the Ag epoxy to the bonding sites of the lead frame arranged sideways.

The moving device of the present invention includes a pushing piece for moving forward the lead frame, which the Ag epoxy has been applied to at the Ag epoxy supply station and is moved to a predetermined location on the traveling rail precisely by the frame transferring device.

The preheating station includes: a magazine for accommodating the lead frames transferred by the pushing piece of the traveling rail in its inner side where multiple piling grooves are formed up and down; an elevator for moving the magazine up and down so as to allow the lead frames to be inserted into the piling grooves or to be ejected out in sequence; an ejector for ejecting the lead frames piled up in the magazine one by one; and a heater for preheating the adhesive tape stuck to the lead frame by maintaining the internal temperature of a preheater housing the magazine at proper degree or directly passing the lead frame where the Ag epoxy is applied.

The wafer placement station includes: a circle ring for retaining a wafer supplied through the supplying path from the wafer supply station within a specified range; and an up/down pin driver installed in the lower portion of the circle ring for pushing up each die on the wafer so as to allow easy separation of dice.

The die transferring device includes: a vacuum pad for picking up the die of the semiconductor device successively moving to a specified location at the circle ring in the wafer placement station and placing the die to the predetermined site in the lead frame; and a driver for moving the vacuum pad back and forth along a predetermined track so as to transfer the die to a work site for the die bonding.

The die bonding station includes: a traveling rail for receiving the lead frames one by one from the preheating station after completion of coating; a die fitting device for supporting the die transferred by the vacuum pad below the lead frame; a head for pressing the die supported by the die fitting device from above while receiving the heat generated by the heater.

The stocker of the present invention includes: a plurality of stocker magazines having multiple piling grooves formed up and down, for receiving the lead frames having the dice attached thereto from the die bonding station in a manner of putting one upon another using a charger; a supplier for pushing the stocker magazine to a conveyance unit; and the conveyance unit for conveying and stacking up the stocker magazines neatly on an easily movable piling plate through up and down or back and forth movement if the stocker magazine is moved thereto.

The conveyance unit is moved back and forth by a horizontal driver while being moved up and down by a vertical driver, and the stocker magazines collected on the piling plate are neatly arranged by a magazine charger and then carried outside by a magazine discharger.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENT

Reference will now be made in detail to the preferred embodiments of the present invention, examples of which are illustrated in the accompanying drawings.

With reference to the accompanying drawings, the present invention will now be described in detail.

Figure 3:
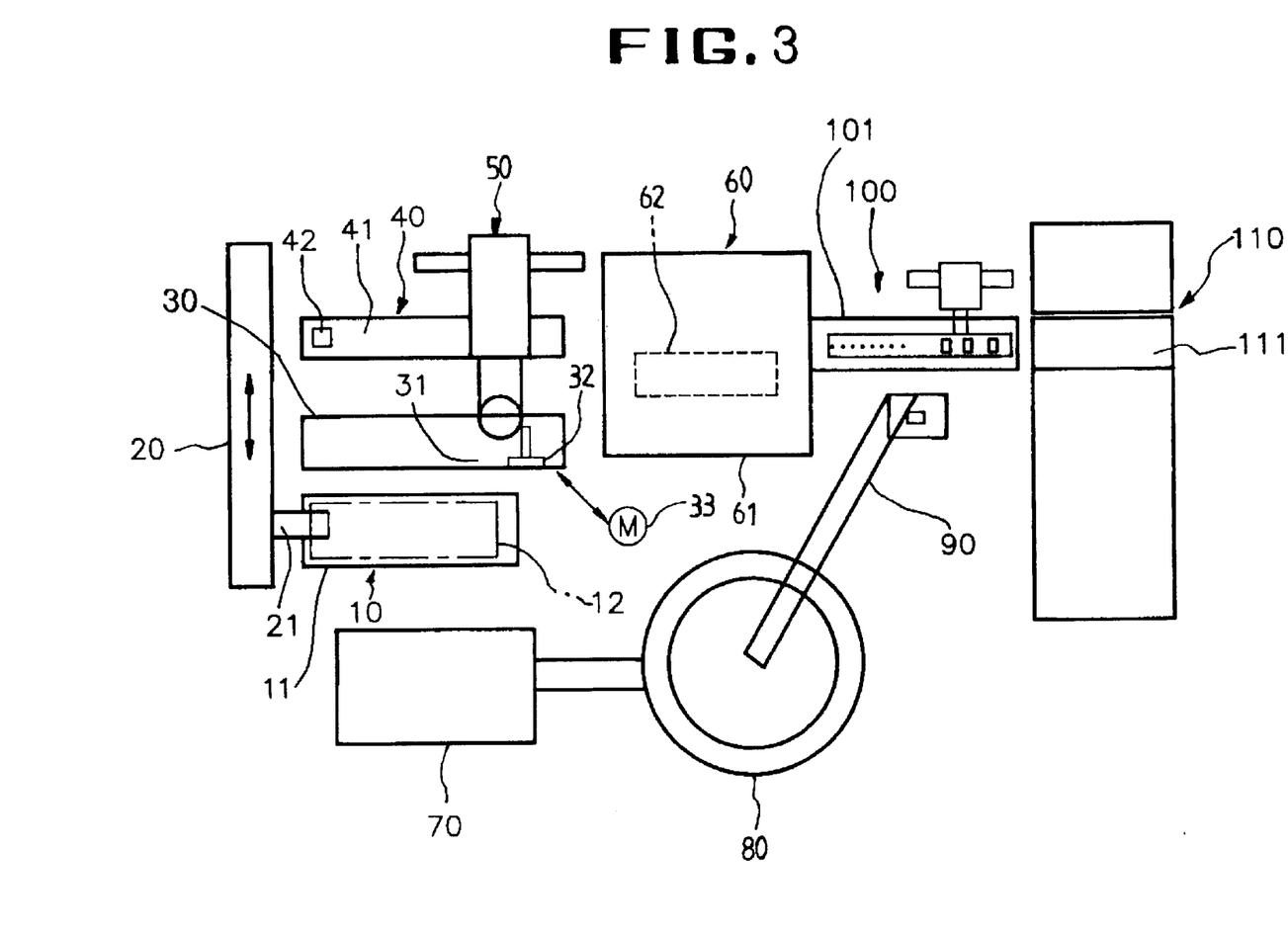
FIG. 3 is a schematic view showing an overall configuration of the present invention.
Figure 4:
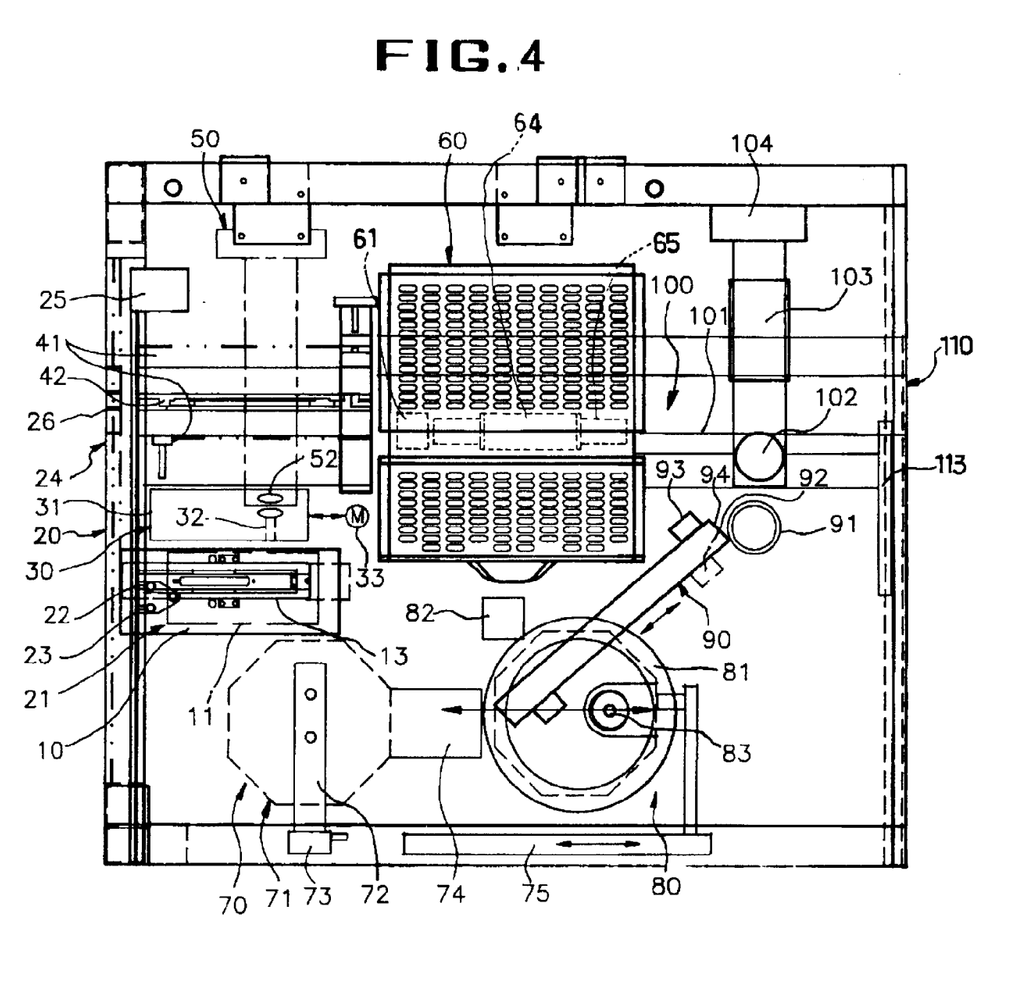
FIG. 4 is a top plan view of the present invention.
Figure 5:
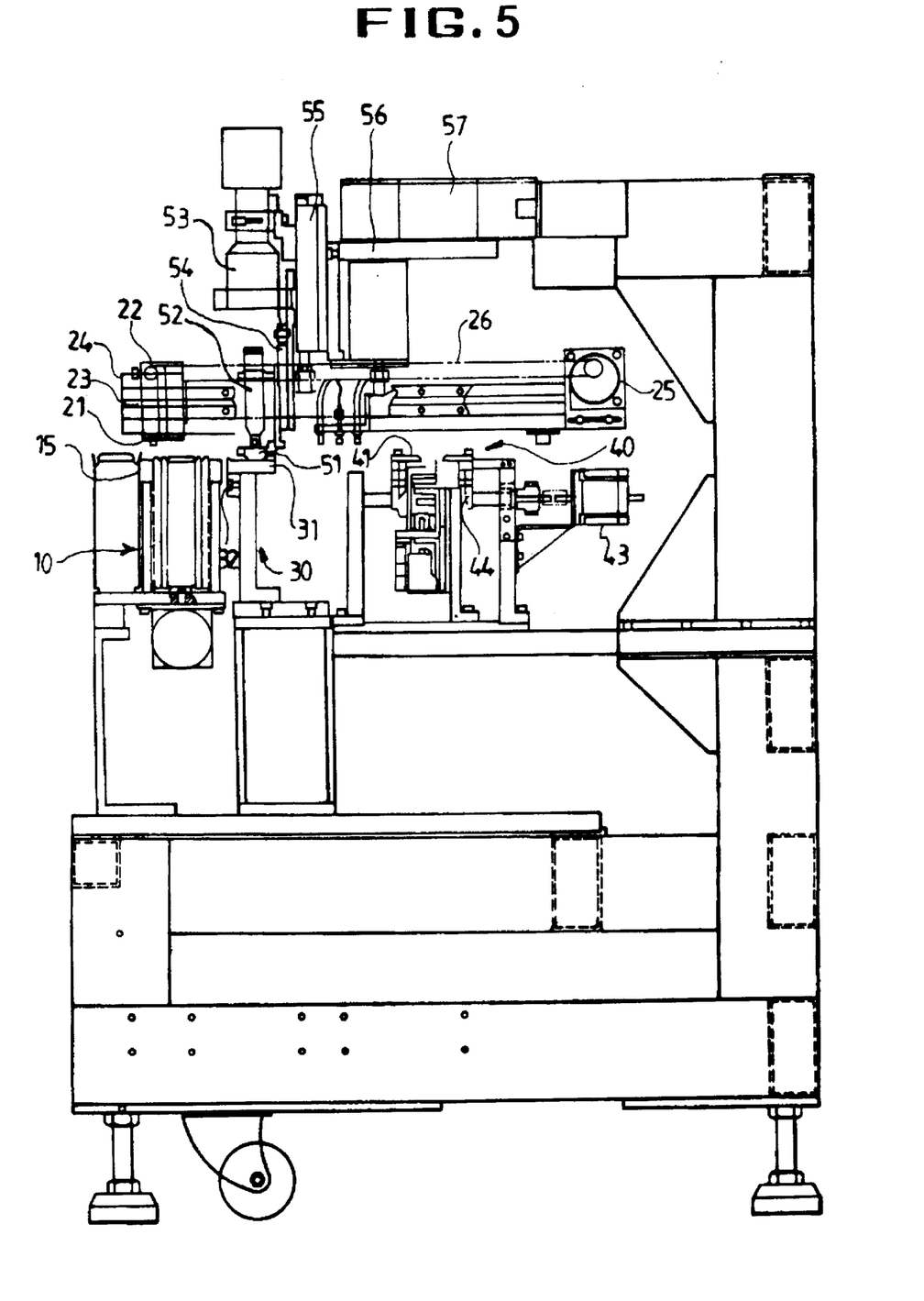
FIG. 5 is a side view of the present invention showing how Ag epoxy is applied to a lead frame.

As shown in FIG. 3, the die bonding apparatus according to one embodiment of this invention includes: a lead frame supply station 10 made in the form of a loading box 11 for accommodating a plurality of lead frames 12 by way of putting one upon another; a frame transferring device 20 for picking up the lead frame 12 piled in the lead frame supply station 10 using a vacuum suction 21 and transferring it to an Ag epoxy application table 31 and then transferring it to a traveling rail 41; a frame fixing station 30 for fixing the lead frame 12, which has been transferred by the vacuum suction 21 in the frame transferring device 20, to the Ag epoxy application table 31 by adsorbing the lead frame 12 using the vacuum pump 32 or moving it back and forth through actuation of a motor 33; an Ag epoxy supply station 50 for ejecting a predetermined amount of Ag epoxy through a nozzle to the top surface of the lead frame fixed to the Ag epoxy application table 31 of the frame fixing station 30, the top surface being in contact with a die; a moving device 40 for moving the lead frame 12, which is transferred by the vacuum suction 21 of the frame transferring device 20 after the Ag epoxy is applied to its top surface at the Ag epoxy supply station 50, to the front using a pushing piece 42 on a traveling rail 41; a preheating station 60 for directly transferring the lead frame 12 moved forward on the traveling rail 41 in the moving device 40 to a die bonding station or, for accommodating the multiple lead frames into a magazine 62 while moving the magazine 62 up and down and preheating the lead frames before transferring them; a wafer supply station 70 for sequentially supplying each wafer of a semiconductor device externally and manually supplied thereto; a wafer placement station 80 for transferring the wafer sequentially transferred from the wafer supply station 70 to a predetermined location through rotation; a die transferring device 90 for picking up each die of the semiconductor device placed at the predetermined location in the wafer placement station 80 one by one and transferring the die to a work site for the die bonding; a die bonding station 100 for precisely bonding the die transferred by the die transferring device 90 to a site where the tape is stuck or the Ag epoxy is applied in the lead frame which has been fed from the preheating station 60 via a traveling rail 101 according to the LOC or normal feature of the lead frame; and a stocker 110 for accommodating the lead frames 12 to which each die of the semiconductor device has been stably bonded at the die bonding station 100 while moving a stocker magazine 111 up and down.

As shown in FIGS. 4 to 8, the frame transferring device 20 includes: the vacuum suction 21 for picking up the lead frames 12 which are piled up in the loading box 13 in the lead frame supply station 10; an up-and-down shifter 22 for rasing or putting down the lead frame 12 by moving up and down the vacuum suction 21 which is installed in a bracket 24 using an air cylinder 23; and a right and left shifter 25 for transferring the lead frame to the traveling rail 41 in the moving device 40 or to the Ag epoxy application table 31 in the frame fixing station 30 by moving the vacuum suction 21 and up-and-down shifter 22 which are installed in the bracket 24 to the right and left through a belt 26.

The frame fixing station 30 of the present invention is designed to place the lead frame 12 carried by the vacuum suction 21 in the frame transferring device 20 on the precise specified site of the Ag epoxy application table 31 and temporarily fixing the lead frame 12 by adsorbing it with the vacuum pump 32 or moving the lead frame 12 back and forth through the actuation of the motor 33 according to the Ag epoxy application status.

The Ag epoxy supply station 50 includes: a nozzle 51 for ejecting the predetermined amount of Ag epoxy to the site where the die will be placed in the lead frame 12 temporarily fixed to the Ag epoxy application table 31; a pumping device 52 connected to the upper portion of the nozzle 51, for pumping the predetermined amount of the Ag epoxy at a time with proper pressure for a predetermined period of time once reaching the application site so as to eject the Ag epoxy; a camera 53 located over the pumping device 52, for monitoring the nozzle 51 so as to allow the Ag epoxy to be ejected to the precise application site in the lead frame 12; a Z axis driver 55 for moving up and down a bracket 54 where the nozzle 51, pumping device 52, and camera 53 are installed so as to allow the easy movement of the lead frame 12 or the application of the Ag epoxy 6 to the lead frame 12 from directly above; and an X axis driver 57 for moving a bracket 56 including the Z axis driver 55 to the right and left so as to allow the application of the Ag epoxy 5 to the bonding sites of the lead frame 12 arranged sideways, from directly above.

The moving device 40 of the present invention is designed such that once the lead frame 12 to which the Ag epoxy is precisely applied at the Ag epoxy supply station 50 is picked up by the vacuum suction 21 of the frame transferring device 20 and moved to a predetermined location on the traveling rail 41 precisely, the lead frame is moved forward by the pushing piece 42 at the proper time to be supplied to the magazine 62 of the preheating station 60 and the motor 43 is actuated and rotates the traveling rail 41 through a transmission gear 44, thereby to achieve the smooth shift of the lead frame.

The preheating station 60 includes: the magazine 62 for accommodating the lead frames 12 transferred by the pushing piece 42 in the moving device 40 into its inner side where multiple piling grooves 63 are formed up and down; an elevator 64 for moving the magazine 62 step by step in the up-and-down direction so as to allow the lead frames 12 to be inserted into the piling grooves 63 or to be ejected out in sequence; an ejector 65 for picking the lead frames 12 piled up in the magazine one by one and ejecting them out; and a heater 61 for preheating the adhesive tape stuck to the lead frame 12 by maintaining the internal temperature of a preheating station 60 housing the magazine 62 at proper degree, thus preheating the lead frame 12 to which the adhesive tape is stuck before ejection and for directly passing the lead frame 12 which the Ag epoxy is applied to without preheating.

The wafer supply station 70 includes: a supply box 71 having an opening top, for holding the semiconductor wafers externally and manually supplied; and a wafer loader/unloader 72 installed in the lower portion of the supply box 71, for supplying a new wafer to a supply path 74 in succession while moving up and down depending upon the actuation of a motor 73.

The wafer placement station 80 includes: a cylindroid circle ring 81 with an opening top, for retaining the wafer supplied through the supply path 74 from the wafer supply station 70 within a specified range; and an up/down pin driver 82 installed in the lower portion of the circle ring 81 for pushing each die on the wafer to separate each die while rotating the circle ring 81 about a shaft 83 at low speed.

The die transferring device 90 includes: a vacuum pad 91 for picking up each die of the semiconductor device moved to a specified location in the circle ring 81 of the wafer placement station 80 using a pick up piece 92 and moving the die to the predetermined bonding site in the lead frame 12; and a driver 93 for moving the vacuum pad 91 back and forth along a predetermined track 94 so as to transfer the die below the lead frame which is a work site for the die bonding.

The die bonding station 100 includes: a traveling rail 101 for receiving and moving the lead frame 12 preheated at the preheating station 60; a die fitting device 102 for supporting the die below the lead frame 12 transferred along the traveling rail 101; a first up-and-down shifter 104 for moving a heater 103 and die fitting device 102 up and down;

a head 105 for pressing the die supported by the die fitting device 102 through up and down movement by a second up-and-down shifter 106 over the traveling rail 101 while the heat generated by the internal heater 103 is being applied thereto; and a suction head 107 for retaining the die supplied by the vacuum pad 91 with suction power and mounting the die to the lead frame 12 from above.

The die bonding station 100 receives the die of the semiconductor device supplied by the vacuum pad 91 through the die fitting device 102 in its lower portion or the suction head 107 in its upper portion considering that the lead frame 12 transferred along the traveling rail 101 is for the LOC die bonding or the normal die bonding, and then bonds the die to the lead frame 12 from below or above.

The stocker 110 of the present invention includes: a plurality of stocker magazines 111 having multiple piling grooves 112 up and down, for receiving the lead frames 12 having the dice bonded thereto from the die bonding station 100 and piling and storing them; a charger 113 for pushing each lead frame 12 into the piling grooves in the stocker magazine 111 in turn; a supplier 114 for pushing the stocker magazine 111 to a conveyance unit 115; and the conveyance unit 115 for conveying and stacking up each stocker magazine 111 neatly on a easily movable piling plate 116 through up and down or back and forth movement.

The conveyance unit 115 is moved back and forth by a horizontal driver 118 while being moved up and down by a vertical driver 117, and the stocker magazines collected on the piling plate are neatly arranged by a magazine charger and then carried outside by a magazine discharger.

In such die bonding apparatus of the present invention, in case of selecting control for Ag epoxy application after manually piling up the lead frames 12 to be process with the Ag epoxy in the loading box 11 in the lead frame supply station 10, a controller recognizes this and controls the operation in such a manner that picks up each lead frame using the vacuum suction 21, moves up the vacuum suction 21 installed in the bracket 24 using the air cylinder 23 transmitting the power created by the up-and-down shifter 22, then moves the vacuum suction 21 holding the lead frame over the Ag epoxy application table 31 in the frame fixing station 30 using the belt 26 receiving the power created by the right and left shifter 25, and, subsequently, moves the vacuum suction 21 downward using the air cylinder 23 transmitting the power from the up-and-down shifter 22, thereby to safely mount the lead frame 12 to the Ag epoxy application table 31.

The lead frame 12 which is moved to the precise location on the Ag epoxy application table 31 by the vacuum suction 21 in the frame transferring device 20 is temporarily fixed to the Ag epoxy application table 31 by the suction power of the vacuum pump 32 installed in the lower portion.

Once the lead frame 12 is fixed, the Ag epoxy supply station 50 performs precise application of the Ag epoxy to the application site in the lead frame using the camera 53.

Subsequently, the motor 33 in the frame fixing station 30 is actuated and moves the lead frame 12 fixed by the vacuum pump 32 back and forth to apply the Ag epoxy to overall portion.

At this time, if the Z axis driver 55 is actuated, the bracket 54 in which the nozzle 51, pumping device 52, and camera 53 are installed is moved up and down so as to make the die be in contact with the nozzle 51 directly over the lead frame 12.

In case where two or more sites for bonding of dice are formed in the lead frame, the X axis driver 57 in the Ag epoxy supply station 50 is actuated and moves the bracket 56 including the Z axis driver 55 to the right and left so as to allow the application of the Ag epoxy to the bonding sites arranged side by side in the lead frame 12.

Then the proper pressure is given to the pumping device 52 connected to the upper portion of the nozzle 51 for the predetermined period of time, so the specified amount of the Ag epoxy is ejected to the bonding site in the lead frame 12.

Once the application of the Ag epoxy to the lead frame 12 is completed, the lead frame 12 is picked up by the vacuum suction 21 of the frame transferring device 20 and transferred to the traveling rail 41 by moving up the vacuum suction 21 installed in the bracket 24 using the air cylinder 23 transmitting the power created by the up-and-down shifter 22, then moving the vacuum suction 21 over the traveling rail 41 in the moving device 40 using the belt 26 receiving the power created by the right-and-left shifter 25, and, subsequently, moving it downward using the air cylinder 23 transmitting the power from the up-and-down shifter 22.

The lead frame 12 which has been transferred to the traveling rail 41 after the application of the Ag epoxy to the lead frame 12 is moved forward at the proper time to be supplied to the magazine 62 of the preheating station 60 by the pushing piece 42.

The Ag epoxy applied lead frame 12 which has been moved forward by the pushing piece 42 is directly ejected by the ejector 65 without preheating in the preheating station 60.

If the dice is manually supplied to the supply box 71 having the opening top in the wafer supply station 70 by an operator, the wafer loader/unloader 72 sustains successive supply of new wafer to the wafer supply path 74.

The wafer supplied through the supply path 74 of the wafer supply station 70 is transferred to and received into the cylindroid circle ring 81 having the opening top in the wafer placement station 80, the circle ring 81 being rotated about the shaft 83 at the low speed by the up/down pin driver 82 installed in its lower part.

Each die of the wafer received into the circle ring 81 in the wafer placement station 80 is picked up one by one by the pick up piece 92 actuated by the vacuum pad 91 in the die transferring device 90 and transferred to the predetermined bonding site in the lead frame 12.

The vacuum pad 91 transfers the die to the suction head 107 in the die bonding station 100 which is the work site of the die bonding while being moved back and forth along the predetermined track 94 by the driver 93.

Figure 6A:
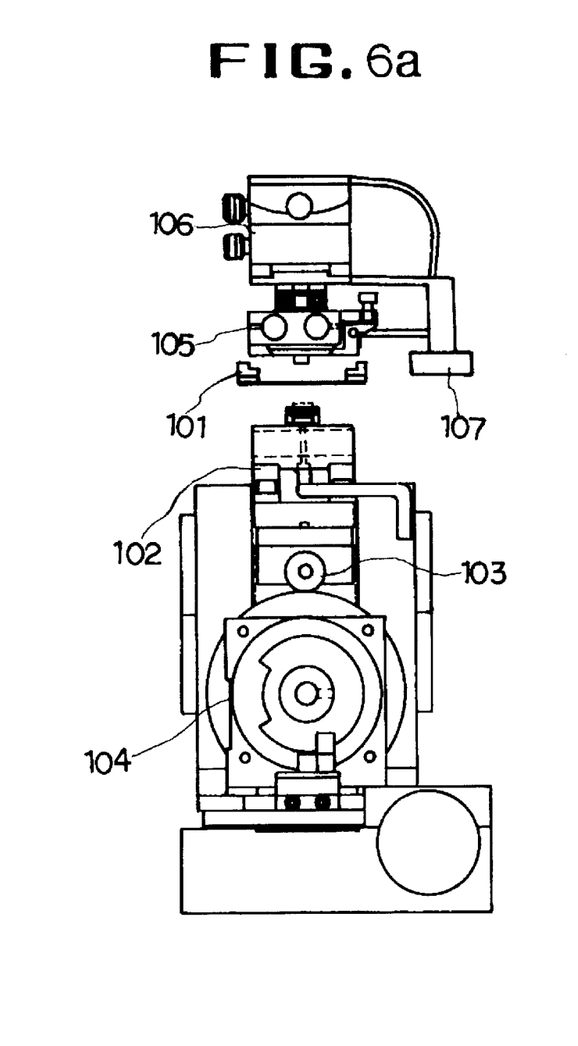
FIGS. 6a and 6b are front elevation views of each die bonding station performing the LOC die bonding and the normal die bonding.
Figure 6B:
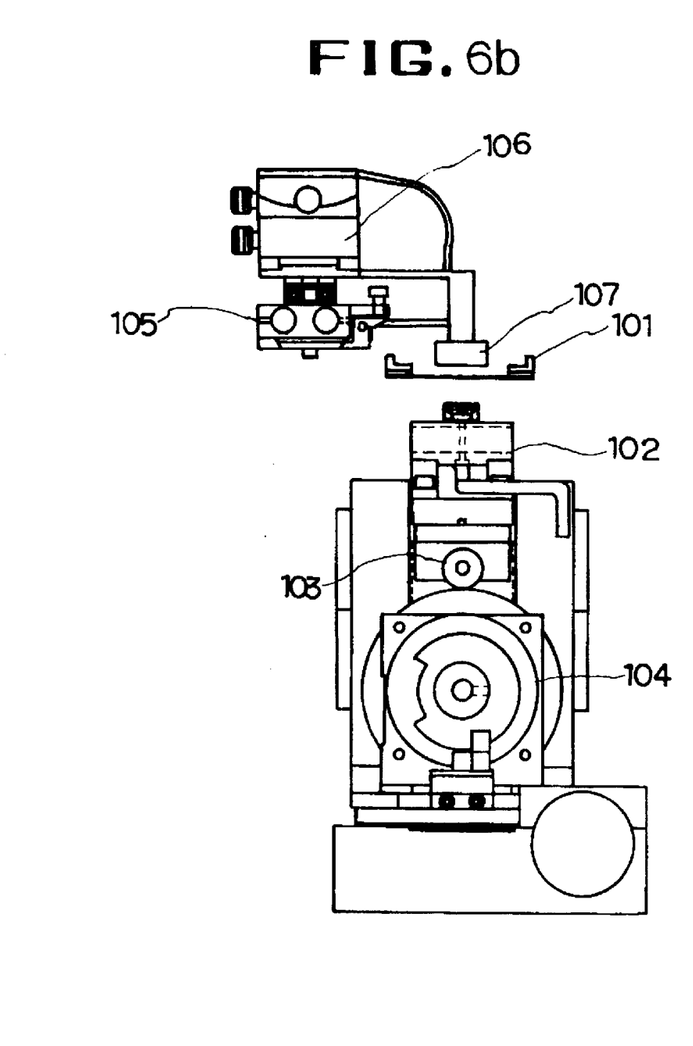
Figure 7:
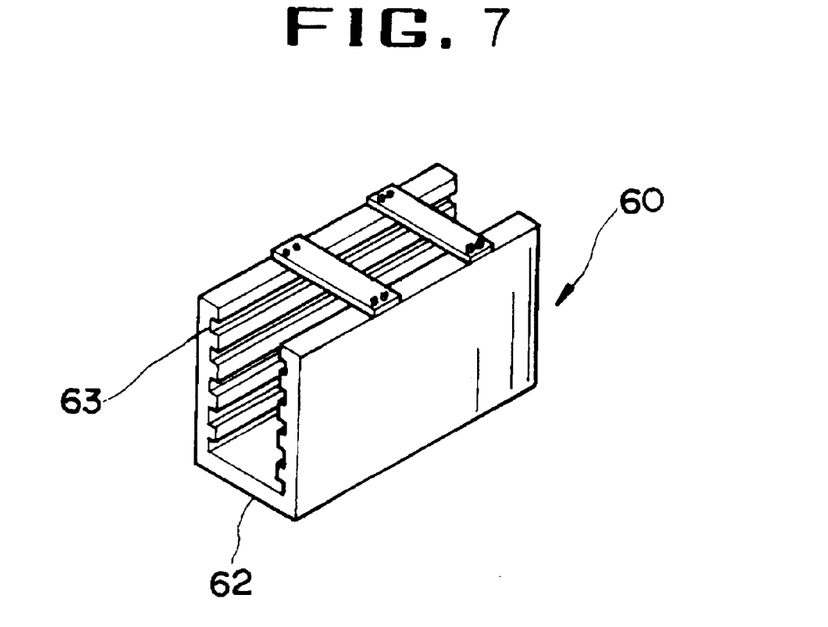
FIG. 7 is a perspective view of the magazine in the preheating station of the present invention.
Figure 8:
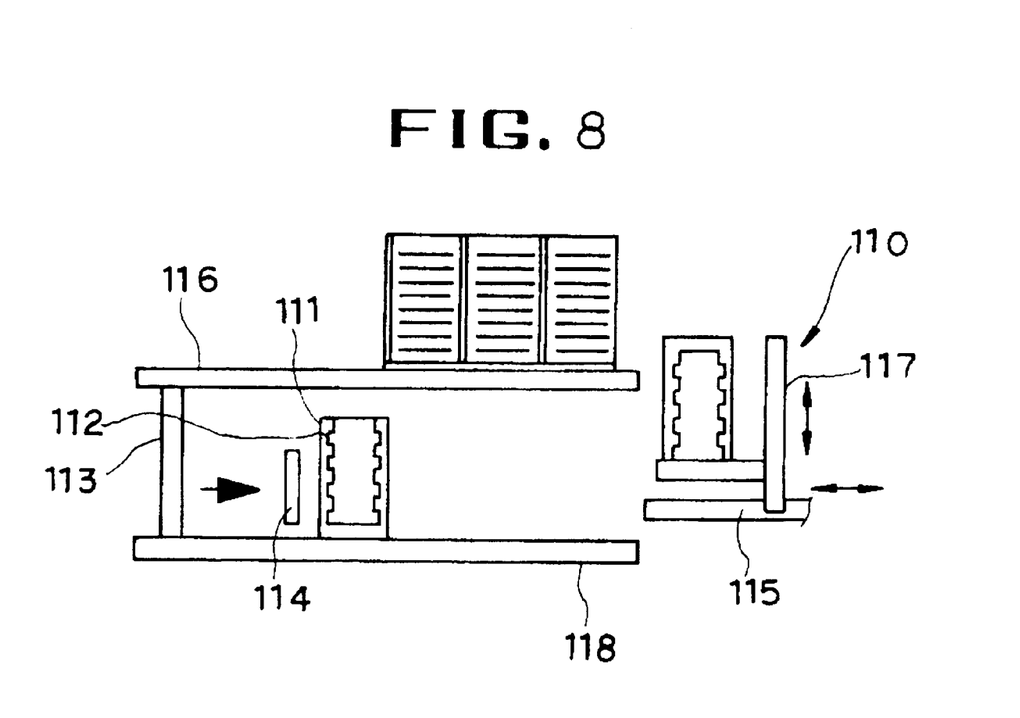
FIG. 8 is a side view of the stocker of the present invention.

The die bonding station 100, as shown in FIG. 6b, locates the suction head 107 over the traveling rail 101 so as to bond the die to the lead frame by way of the normal die bonding.

While the lead frame 12 supplied by the ejector 65 in the preheating station 60 is put on the top surface of the traveling rail 101 and transferred, the die transferred by the vacuum pad 91 in the die transferring device 90 is supported by the die fitting device 102 below the lead frame 12, so the die is bonded to the lead frame by the head 105 in the upper portion.

The lead frame 12 to which the die is bonded in the die bonding station 100 is transferred toward the stocker 110 through the traveling rail 101. The charger 113 picks up the lead frame 12 and inserts it into the piling grooves 112 formed in the stocker magazine 111 up and down.

If a predetermined amount of the stocker magazines 111 is collected on the conveyance unit 115, the conveyance unit 115 is moved back and forth by the horizontal driver 118 while being moved up and down by the vertical driver 117, so the stocker magazines 111 are stacked up neatly on the piling plate 116, which is readily moved, and then carried outside by the magazine discharger.

Alternatively, in case where the normal die bonding is performed with respect to the lead frame to the bottom of which the adhesive tape is stuck for the LOC die bonding, the controller recognizes this and controls the operation in such a manner that picks up each lead frame using the vacuum suction 21, moves up the vacuum suction 21 installed in the bracket 24 using the air cylinder 23 transmitting the power created by the up-and-down shifter 22, then moves it over the traveling rail 41 of the moving device 40 using the belt 26 receiving the power created by the right and left shifter 25, and, subsequently, moves it downward using the air cylinder 23 transmitting the power from the up-and-down shifter 22, thereby to safely mount the lead frame 12 on the traveling rail 41.

The lead frame 12 to the bottom of which the adhesive tape is stuck is then moved forward by the pushing piece 42 at the proper time to be supplied to the magazine 62 of the preheating station 60.

The preheating station 60 receives the lead frames moved forward by the pushing piece 42 into the piling grooves 63 formed in the magazine 62 while moving the magazine 62 up and down and step by step through the elevator 64.

The heater 61 maintains the inner temperature of the preheater station 60 housing the magazine 62 at the proper degree so as to preheat the adhesive tape on the lead frame before ejecting each lead frame one by one using the ejector 65.

The vacuum pad 91 of the die transferring device 90 transfers the die to the die fitting device 102 which is the work site of the die bonding while being moved back and forth along the predetermined track 94 by the driver 93.

The die bonding station 100 receiving the lead frame 12 transferred by the ejector 65 into the preheating station 60, as shown in FIG. 6a, supports the die transferred by the vacuum pad 91 in the die transferring device 90 using the die fitting device 102 below the lead frame 12 which is put on the top surface of the traveling rail 101 and transferred, and bonds the die to the lead frame by pressing them for a short time with the head 105 in the upper portion while the heat generated by the heater 103 is applied thereto.

Accordingly, the die bonding apparatus of the present invention selectively performs the LOC die bonding and normal die bonding through regulation of a simple control function when bonding semiconductor chips of a memory device from a wafer to lead frames, thereby to increase efficiency in use of equipment and reduce the cost for equipment.

It will be apparent to those skilled in the art that various modifications and variations can be made in a die bonding apparatus of the present invention without deviating from the spirit or scope of the invention. Thus, it is intended that the present invention cover the modifications and variations of this invention provided they come within the scope of the appended claims and their equivalents.

What is claimed is:

1. A die bonding apparatus comprising:
   a lead frame supply station made in the form of a loading box for accommodating a plurality of lead frames by putting one lead frame upon another lead frame;
   a frame transferring device for picking up a lead frame from said lead frame supply station using vacuum suction and transferring said lead frame to selectively one of an Ag epoxy application table and a first traveling rail;
   a frame fixing station for fixing the lead frame transferred by said frame transferring device to said Ag epoxy application table by suction power of a vacuum pump and moving said lead frame back and forth through actuation of a motor;
   an Ag epoxy supply station for ejecting a predetermined amount of Ag epoxy through a nozzle to a top surface of said lead frame fixed to said Ag epoxy application table in said frame fixing station;
   a moving device for moving said lead frame forward on said first traveling rail;
   a preheating station for receiving said lead frame moved forward on said first traveling rail in said moving device into a magazine of a preheater and preheating said lead frame, thereby to complete coating;
   a wafer placement station for transferring wafers sequentially supplied by a wafer supply station to a predetermined location through rotation wherein said wafer includes one or more dies each having a unit device;
   a die transferring device for individually picking up said each die of a semiconductor device placed at a predetermined location in said wafer placement station and transferring said die to a work site for die bonding;
   a die bonding station for precisely bonding the die transferred by said die transferring device to a site where selectively either a tape is stuck or Ag epoxy is applied in said lead frame and the selection is based upon whether the die is a lead on chip or normal bonding feature of, said lead frame having been completely coating-processed and fed from said preheating station via a second traveling rail; and
   a stocker for accommodating said lead frame to which said die of said semiconductor device has been stably bonded at said die bonding station into an internal magazine.

2. The apparatus according to claim 1, wherein said second traveling rail receives and moves a lead frame preheated at said preheating station, and wherein said die bonding station comprises:
   a die fitting device for supporting said die below the lead frame transferred along said second traveling rail;
   a first up-and-down mover for moving a heater and said die fitting device up and down;
   a head for pressing down the die supported by said die fitting device through up and down movement by a second up-and-down mover from above said second traveling rail while heat generated by said heater is applied; and
   a suction head for holding said die supplied by said vacuum pad through suction power and bonding said die to said lead frame from above, thereby to bond said die transferred by said die transferring device to said site where selectively either a tape is stuck in said lead frame from below or said Ag epoxy is applied in the lead frame from above and the selection is based on whether the die is a lead on chip or normal feature of said lead frame.

* * * * *